(12) United States Patent
Matsushita et al.

(10) Patent No.: US 7,517,464 B2
(45) Date of Patent: Apr. 14, 2009

(54) METHOD FOR MANUFACTURING AN LCD DEVICE

(75) Inventors: Hidekazu Matsushita, Kagoshima (JP); Tsuyoshi Katoh, Kagoshima (JP); Satoshi Doi, Kagoshima (JP); Akitoshi Maeda, Kagoshima (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 0 days.

(21) Appl. No.: 11/396,721

(22) Filed: Apr. 4, 2006

(65) Prior Publication Data

US 2006/0175286 A1      Aug. 10, 2006

Related U.S. Application Data

(62) Division of application No. 10/704,670, filed on Nov. 12, 2003, now abandoned.

(30) Foreign Application Priority Data

Nov. 15, 2002   (JP) .............................. 2002-332484

(51) Int. Cl.
*C30B 33/00* (2006.01)
(52) U.S. Cl. .............................. 216/23; 216/41; 216/67; 216/83; 438/706; 438/720
(58) Field of Classification Search .................. 216/23, 216/41, 67, 83, 57; 438/706, 720; 349/42
See application file for complete search history.

(56) References Cited

U.S. PATENT DOCUMENTS 6,068,953 A * 5/2000 Matsumoto et al. ............ 430/7
6,160,270 A * 12/2000 Holmberg et al. ............. 257/59
6,259,495 B1 * 7/2001 Maeda ......................... 349/42
6,329,298 B1   12/2001 Fukuyama
6,371,357 B1 * 4/2002 Watanabe .................... 228/138
6,372,535 B1    4/2002 Lyu
6,407,486 B1 * 6/2002 Kimura et al. .............. 310/364
6,468,385 B2   10/2002 Lin
6,894,311 B2    5/2005 Maeda et al.

FOREIGN PATENT DOCUMENTS

| JP | 7-13180 A | 1/1995 |
|---|---|---|
| JP | 8-62628 A | 3/1996 |
| JP | 09-203886 A | 8/1997 |
| JP | 9-203886 A | 8/1997 |
| JP | 10-206892 A | 8/1998 |
| JP | 10-319441 A | 12/1998 |
| JP | 11-126777 A | 5/1999 |
| JP | 2001-36095 A | 2/2001 |
| JP | 2002-129362 A | 5/2002 |
| KR | 1998-070918 A | 10/1998 |
| KR | 2001-083687 A | 9/2001 |

* cited by examiner

*Primary Examiner*—Shamim Ahmed
(74) *Attorney, Agent, or Firm*—Sughrue Mion, PLLC

(57) ABSTRACT

A method for manufacturing a TFT panel of an LCD device includes the steps of wet etching a multilayer metallic structure including a high-melting-point metal film (HMPM) film, Al film and another HMPM film while using side etching technique by using a photoresist mask, hot-water washing the side walls of the Al film after the wet etching, and dry etching for configuring the channel region of a TFT in each pixel, and removing the photoresist mask. The presence of the photoresist mask and the protection film prevents corrosion of Al caused by plasma of the etching gas in the dry etching.

13 Claims, 15 Drawing Sheets

METHOD FOR MANUFACTURING AN LCD DEVICE

This is a divisional of application Ser. No. 10/704,670 filed Nov. 12, 2003, now abandoned, the entire disclosure of which is hereby incorporated by reference.

BACKGROUND OF THE INVENTION (a) Field of the Invention

The present invention relates to a method for manufacturing an LCD (liquid crystal display) device and, more particularly, to a method for manufacturing an LCD device having therein an aluminum (Al) or Al-alloy film pattern which constitutes metallic lines and electrodes.

(b) Description of the Related Art

An LCD device having thin-film transistors (TFT) as switching devices generally suffers from a problem in the operational speed thereof and a cross-talk problem if the scanning lines or signal lines involve a larger propagation delay. In particular, a large-size high-definition LCD device uses a low-resistivity substance for the material of the scanning lines and signal lines for avoiding such a problem. Although Al or Al alloy is widely used as the low-resistivity substance for implementing the metallic lines, Al or Al alloy is generally combined with a high-melting-point metal (HMPM) to form multilayer metallic lines. Such an multilayer metallic line may have a two-layer metallic structure, such as HMPM film (top layer)/Al film (bottom layer), or three-layer metallic structure, such as HMPM film/Al film/HMPM film, thereby assuring a suitable ohmic contact with a semiconductor layer and/or a transparent conductive layer.

The multilayer metallic line having the above two-layer or three-layer metallic structure may be patterned using a single photolithographic and etching step for the purpose of reducing the number of photolithographic and etching steps and thus reducing the fabrication costs. In this case, Al or Al-alloy film (simply referred to as Al film collectively, hereinafter) appears on the side walls of the resultant metallic line.

In fabrication of a TFT panel of a reverse-staggered type having the three-layer metallic structure in the signal lines, a dray etching process is generally used for configuring the channel region of the TFT and patterning the semiconductor layers. The dry etching generally uses fluorine-based gas such as $SF_6$ and $CHF_3$, chlorine-based gas such as $Cl_2$ and HCl, or a mixture of these gases. If Al or Al-alloy is exposed from the side walls of the signal lines, as described above in connection with the single photolithographic and etching step, there occurs a problem in that Al in the exposed Al film is corroded by the etching gas during the dry etching. This is considered due to the fact that Al reacts with fluorine-based gas or chlorine-based gas to generate Al fluoride or Al chloride, or that Al reacts with water in the atmosphere to generate hydrofluoric acid or hydrochloric acid, after the TFT panel onto which residual fluorine-based gas or chlorine-based gas is attached is taken out in the atmosphere after the dry etching, the fluoride or acid corroding the Al film. Thus, a method is desired which is capable of manufacturing an LCD device while preventing the Al corrosion.

Patent Publication JP-A-1996-62628 describes a technique for preventing the Al corrosion, wherein an oxide film is formed on the interface between the Al film and the HMPM film and on the side walls of the Al film used as source/drain electrodes and signal lines in an LCD device, thereby preventing the bimetallic local corrosion which may occur during the step of removing resist etc. by peel-off. It is recited in the publication that the side-wall oxide film for the Al film can be formed by plasma oxidation, anodic oxidation, CVD or plasma-enhanced CVD (PVD).

The technique described in the above publication increases the number of fabrication steps by addition of the oxidation or CVD step. In addition, it is difficult to obtain a sufficient thickness of the oxide film by using the plasma oxidation step with a reasonable time length: an oxide film having a small thickness around several nanometers, for example, cannot effectively prevent the Al corrosion caused by the etching gas during the dry etching. The anodic oxidation may provide a sufficient thickness for the oxide film; however, the anodic oxidation limits the choice of the high-melting-point metals allowing the anodic oxidation. For example, Mo is inadequate to the anodic corrosion, as recited in Patent Publication JP-A-1988-276242. The CVD or PVD process may include at least an additional etch-back step for the deposited oxide film to thereby complicate the fabrication process.

In view of the above problems in the conventional technique, it is an object of the present invention to provide a method for manufacturing an LCD device, including the process for forming a layer structure including Al film and an HMPM film substantially without complicating the process and yet capable of preventing the Al corrosion.

The present invention provides, in a first aspect thereof, a method for manufacturing a liquid crystal display (LCD) device including: consecutively forming a semiconductor layer and a multilayer metallic film to overlie a substrate, the multilayer metallic film including a high-melting-point metal (HMPM) film and a first metallic film having a lower resistivity than the HMPM film; forming a photoresist mask on the multilayer metallic film; patterning the multilayer metallic film by using the photoresist mask to form a multilayer metallic pattern, the patterning including a side etching for retracting edges of the multilayer metallic pattern beyond edges of line patterns of the photoresist mask; forming a protection film on exposed portions of the first metallic film; dry-etching at least a portion of the semiconductor layer by using the photoresist mask as an etching mask; and removing the photoresist mask.

The present invention provides, in a second aspect thereof, a method for manufacturing a liquid crystal display (LCD) device including: consecutively forming a semiconductor layer and a multilayer metallic film to overlie a substrate, the multilayer metallic film including a high-melting-point metal (HMPM) film and a first metallic film having a lower resistivity than the HMPM film; forming a photoresist mask on the multilayer metallic film; patterning the multilayer metallic film by using the photoresist mask to form a multilayer metallic pattern, the patterning including a side etching for retracting edges of the multilayer metallic pattern beyond edges of line patterns of the photoresist mask; removing the photoresist pattern; forming a protection film on exposed portions of the first metallic film; and dry-etching at least a portion of the semiconductor layer by using the photoresist mask as an etching mask.

The present invention provides, in a third aspect thereof, a. method for manufacturing a liquid crystal display (LCD) device including: consecutively forming a semiconductor layer and a multilayer metallic film to overlie a substrate, the multilayer metallic film including a high-melting-point metal (HMPM) film and a first metallic film having a lower resistivity than the HMPM film; forming a photoresist mask on the multilayer metallic film; patterning the multilayer metallic film by using the photoresist mask to form a multilayer metallic pattern; dry-etching at least a portion of the semiconductor layer by using the photoresist mask and/or the multilayer metallic pattern as an etching mask; and evacuating a chamber upon completion of the dry-etching step in the chamber to remove etching gas used in the dry-etching step from the substrate including the multilayer metallic pattern.

The present invention provides, in a fourth aspect thereof, a method for manufacturing a liquid crystal display (LCD) device including: consecutively forming a semiconductor layer and a multilayer metallic film to overlie a substrate, the multilayer metallic film including a high-melting-point metal (HMPM) film and a first metallic film having a lower resistivity than the HMPM film; forming a photoresist mask on the multilayer metallic film; patterning the multilayer metallic film by using the photoresist mask to form a multilayer metallic pattern; dry-etching at least a portion of the semiconductor layer by using the photoresist mask as an etching mask; and removing the photoresist mask by using a wet peel-off process and simultaneously washing the substrate including the multilayer metallic pattern within a time length of 10 minutes after completion of the dry-etching step.

The present invention provides, in a fifth aspect thereof, a method for manufacturing a liquid crystal display (LCD) device including: consecutively forming a semiconductor layer and a multilayer metallic film to overlie a substrate, the multilayer metallic film including a high-melting-point metal (HMPM) film and a first metallic film having a lower resistivity than the HMPM film; forming a photoresist mask on the multilayer metallic film; patterning the multilayer metallic film by using the photoresist mask to form a multilayer metallic pattern; removing the photoresist mask; dry-etching at least a portion of the semiconductor layer by using the multilayer metallic pattern as an etching mask; water-washing the substrate including the multilayer metallic pattern within a time length of 10 minutes after completion of the dry-etching step.

In accordance with the methods of the present invention, the corrosion of a metal in the first metallic film due to the etching gas used in the dry etching can be suppressed by respective configurations of the methods of the present invention.

The above and other objects, features and advantages of the present invention will be more apparent from the following description, referring to the accompanying drawings.

PREFERRED EMBODIMENTS OF THE INVENTION

Figure 1:
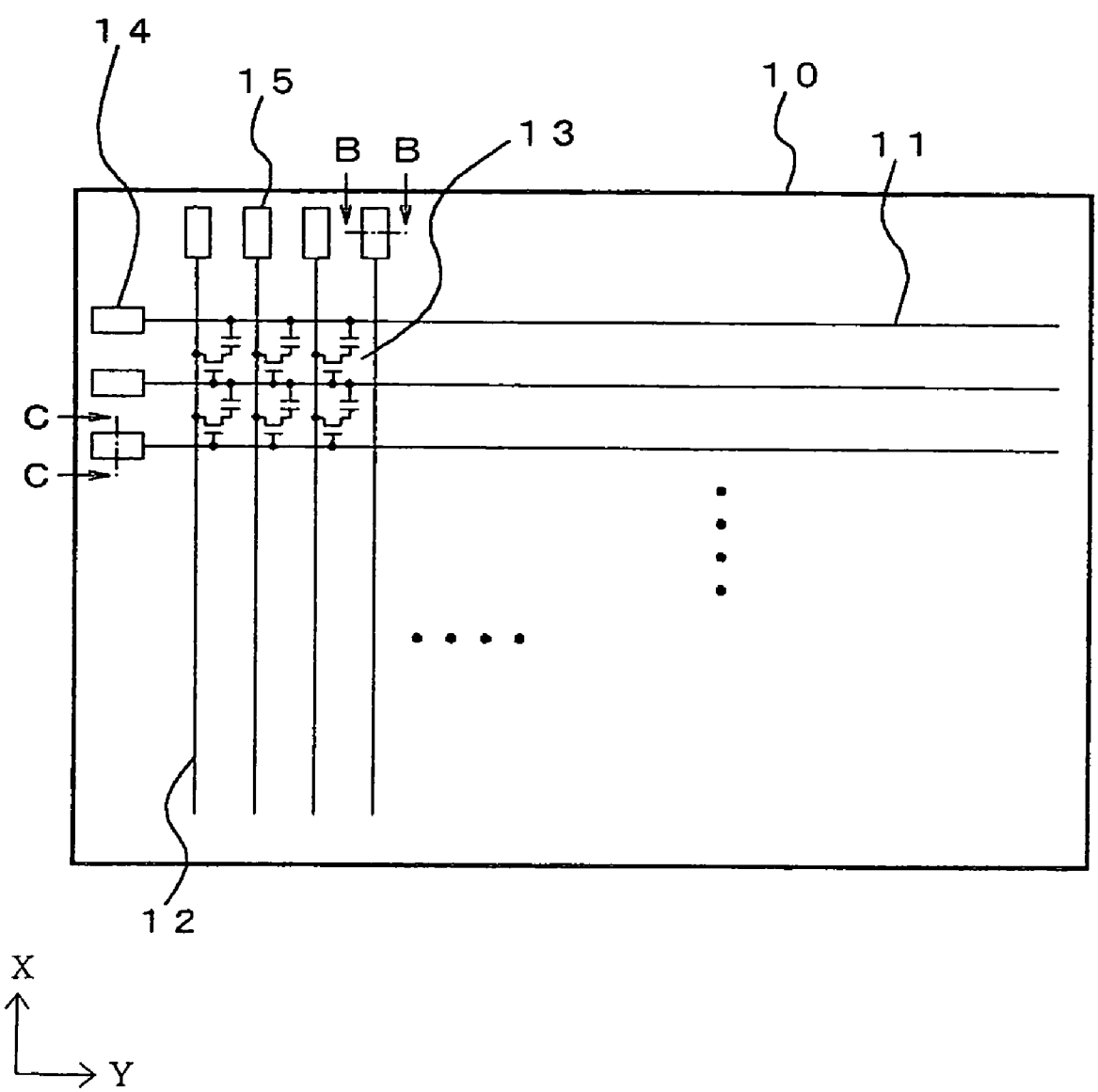
FIG. 1 is a schematic block diagram of an example of a TFT panel in an LCD device to be manufactured by a method according to the present invention.

Now, the present invention is more specifically described with reference to accompanying drawings, wherein similar constituent elements are designated by similar reference numerals throughout the drawings.

Referring to FIG. 1, a TFT panel, generally designated by numeral 10, of an LCD device to be manufactured according to the present invention includes a transparent insulator substrate, on which a plurality of scanning lines 11 extending in Y-direction from scanning terminals 14 and a plurality of signal lines 12 extending in X-direction from signal terminals 15 are formed. An array of pixels each including a TFT 13 are provided in the vicinities of respective intersections of the scanning lines 11 and the signal lines 12. The scanning lines 11 receive address signals from the respective scanning terminals 14, whereas the signal lines 12 receive data signals from the respective signal terminals 15.

Figure 2:
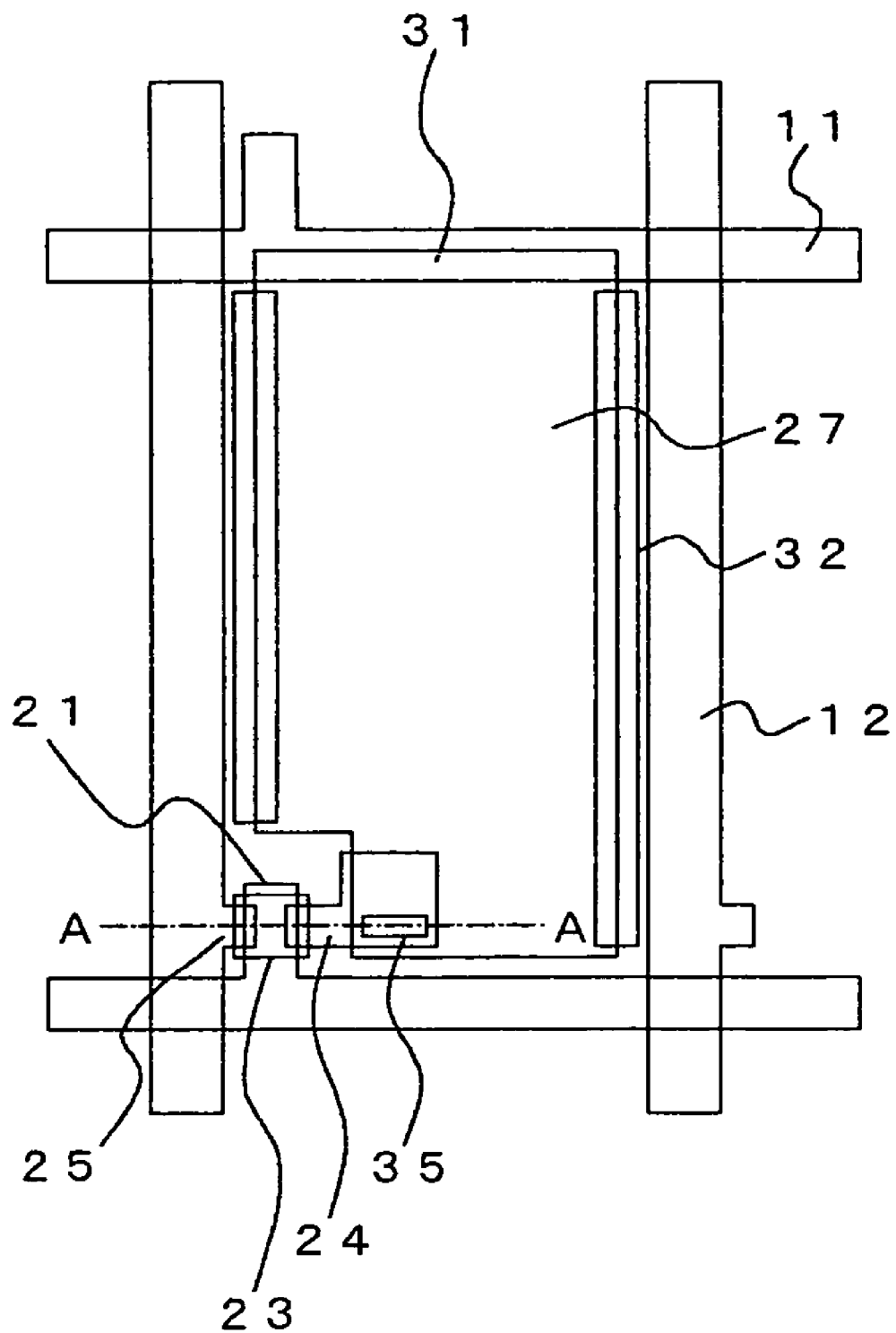
FIG. 2 is a schematic top plan view of a pixel in a TFT panel manufactured by a method according to a first embodiment of the present invention.

Referring to FIG. 2, there is shown the detail of one of the pixels in a TFT panel such as described with reference to FIG. 1. FIGS. 3A to 3E, which are taken along line A-A in FIG. 2, lines (not shown in FIG. 2) corresponding to lines B-B and C-C in FIG. 1, show consecutive steps of a fabrications process for the TFT panel of FIG. 2 according to a first embodiment of the present invention. As shown in FIG. 2, each pixel is disposed in a rectangular pixel area defined by adjacent scanning lines 11 and adjacent signal lines 12. The TFT panel manufactured by the process of the first embodiment, shown in FIGS. 3A to 3E, is of a reverse-staggered channel-etched type.

Figure 3A:
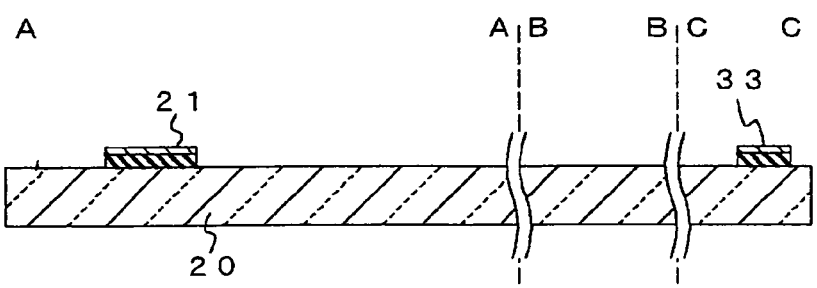
FIGS. 3A to 3E are sectional views of the TFT panel of FIG. 2 in consecutive steps of a fabrication process of the first embodiment.
Figure 3B:
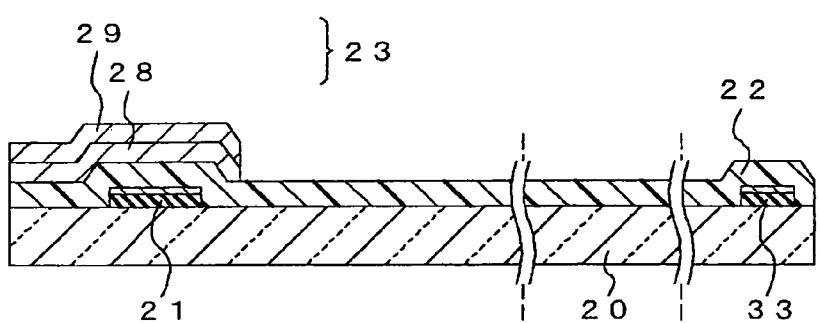
Figure 3C:
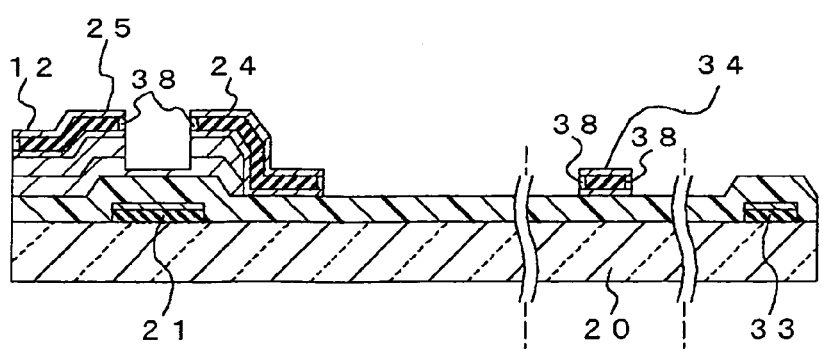
Figure 3D:
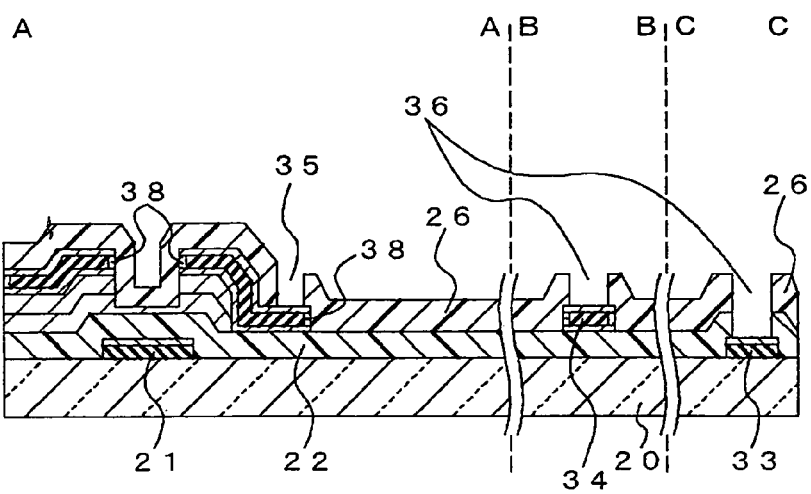
Figure 3E:
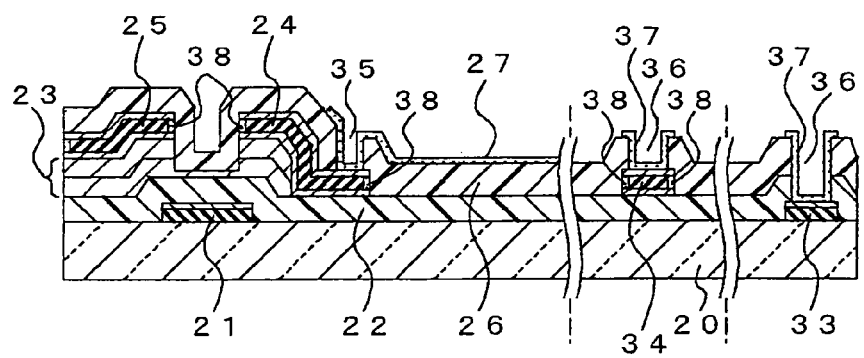

The TFT panel including the pixel shown in FIG. 2 and FIG. 3E includes gate electrodes 21, scanning lines 11 connected to the gate electrodes 21, capacitor electrodes 31 opposing portions of the scanning lines 11, a shield layer 32, metallic terminal films 33 for the scanning terminals 14, which are formed on the transparent insulator substrate 20. A gate insulating film 22 overlies the gate electrode 21 of the TFT, a semiconductor layer 23 is formed on the gate insulating film to oppose the gate electrode 21, and a source electrode 24 and a drain electrode 25 are formed on the semiconductor layer 23. A passivation layer 26 overlies the source electrodes 24, drain electrodes 25, signal lines 12 formed on the gate insulating film 22 and connected to the drain electrodes 25, and metallic terminal film 34 on the signal terminal 15. The passivation layer 26 receives therein a pixel contact hole 36 in the effective pixel area and a terminal contact hole 35 disposed outside the effective pixel area for terminals. A pixel electrode 27 is connected to the source electrode 24 via the pixel contact hole 35. The metallic terminal film 34 is connected to the pad terminal 37 via the terminal contact hole 36. The storage capacitor electrode 31 and the pixel electrode 27 constitute a storage capacitor.

As understood from FIG. 3E, each of the source electrode 24, drain electrode 25, signal line 12 and the metallic terminal film 34 on the signal terminal includes a three-layer structure wherein a pair of HMPM films sandwich therebetween an Al film, which has thereon a side-wall protection film 38.

The method of the present embodiment is used for fabrication of the LCD device shown in FIG. 2, and roughly includes the steps of forming gate electrodes and scanning lines on the transparent insulator substrate (step (a)), forming a gate insulating film and semiconductor layers (step (b)), forming source/drain electrodes and signal lines (step (c)), forming a passivation layer and contact holes therein (step (d)), and forming pixel electrodes (step (e)).

The step (c) forming the source/drain electrodes and signal lines includes the separate steps of forming a three-layer film structure wherein a pair of HMPM films sandwich therebetween an Al film, forming a side-wall protection film for the Al film, and evacuating the chamber after completion of a dry etching step for forming the channel region in a vacuum, without exposing the chamber to the atmosphere.

Referring now to FIG. 3A, an Al film having a thickness of about 200 nm and a high-melting-point film having a thickness of about 100 nm are deposited by sputtering Al or Al-alloy on a 0.7-mm-thick transparent insulator substrate 20 made of non-alkali glass. These films are then patterned by a photolithographic and etching step to form the gate electrodes 21, scanning lines (not shown), shield film (not shown), and metallic terminal films 34 for the signal terminals. This etching may be a dry etching, and is preferably performed by a wet etching step. Examples of the Al-alloy include, although not limited to, aluminum-silicon (Al—Si), aluminum-copper (Al—Cu), and aluminum-neodymium (Al—Nd). Examples of the high-melting-point metal include, although not limited to, chromium (Cr), tantalum (Ta), niobium (Nb), titanium (Ti), hafnium (Hf), zirconium (Zr), molybdenum (Mo), tungsten (W), and alloys or nitrides etc. of these metals. The etching may be wet etching, dry etching or a combination of these etchings.

Subsequently, a gate insulating silicon nitride film 22 having a thickness of about 400 nm, an amorphous silicon (a-Si) film 28 having a thickness of about 200 nm, and a phosphorous-doped N-type a-Si film 29 having a thickness of about 30 nm are consecutively deposited by a plasma-enhanced CVD technique, followed by a photolithographic and etching process to form a semiconductor layer 23 including the a-Si film 28 and N+-type a-Si film 29 on the gate insulating film 22, as shown in FIG. 3B.

Subsequently, an HMPM film having a thickness of about 50 nm, an Al film having a thickness of about 200 nm and an HMPM film having a thickness of about 100 nm are consecutively deposited thereon by sputtering, followed by a photolithographic and etching process to form source/drain electrodes 24 and 25, signal lines 12, metallic terminal films 34 for the signal terminals. This etching should be a wet etching because a treatment for preventing the Al film from corroding is needed thereafter, although a dry etching may be also employed. In a wet etching, materials for the Al-alloy film and the HMPM film should have a sufficient etch selectivity from the transparent insulator substrate and the gate insulating film, and should be etched by an etchant capable of etching the same without a residual substance. For example, Cr or Cr-alloy can be etched using secondary cerium ammonium nitrate and nitric acid, Mo or Mo-alloy by phosphoric acid, nitric acid and acetic acid, and W or W-alloy by hydrogen peroxide solution. In particular, Mo or Mo-alloy is preferable because Mo or Mo-alloy can be etched by an etchant which also etches Al or Al-alloy.

In the method of the present embodiment, the signal line film is side-etched by the wet etching, wherein the edges of the signal line pattern are retracted beyond the edges of the line patterns of the photoresist mask by around 0.5 to 1.0 micrometers. In addition, hot-water washing is conducted at a temperature of 40 to 50 degrees C. after the wet etching, thereby forming a protection film 38 made of Al oxide or hydroxide on the side walls of the Al film. The thickness of the protection film 38 measured in the horizontal direction may be around 200 to 300 nm depending on the temperature of the hot water.

Subsequently, a portion of the N+-type a-Si film 29 between the source electrode 24 and the drain electrode 25 is removed by a dry etching, followed by removal of the photoresist mask as shown in FIG. 3C. This dry etching is performed using fluorine-based gas, chlorine-based gas or mixed gas including fluorine-based gas and chlorine-based gas, such as mixed gas including $SF_6$, HCl and He, or a two-step etching using mixed gas including $CHF_3$, $O_2$ and He and mixed gas including $SF_6$, HCl and He, or a two-step etching using mixed gas using $CHF_3$, $O_2$ and He and mixed gas including $SF_6$, $CHF_3$ and He. However, use of only fluorine-based gas is more preferable. The etching may be either a plasma-enhanced etching (PE mode) or reactive-ion etching (RIE mode). During the dry etching using the gas described above, the protection film 38 formed on the side walls of the Al film protects the Al film against plasma of the etching gas. In addition, the configuration wherein the edges of the signal line pattern is retracted beyond the edges of the photoresist mask pattern and thus shielded by the edge portions thereof allows the side walls of the Al film to be considerably less exposed to the plasma of the etching gas.

After the dry etching, the chamber used for the dry etching is then evacuated using a vacuum pump, wherein the chamber having an internal volume of 120 litters is evacuated for 120 seconds or more, preferably 240 seconds or more, by using a vacuum pump having a evacuation capacity of 100 Pa·(litter)/second at around 25 Pa. The evacuation is conducted, with the substrate being apart from the electrode, so as to remove the etching gas attached onto the bottom surface of the substrate.

After the evacuation, $O_2$, $N_2$, $H_2$ or He gas is introduced into the chamber without exposing the chamber to the atmosphere so as to perform a plasma treatment, wherein the residual fluorine or chlorine components which cannot be removed by the evacuation are substituted.

If the substrate were carried in the atmosphere without removal of the residual fluorine or chlorine components, the residual fluorine or chlorine components will react with water in the atmosphere to form HF or HCl, which corrodes the Al film. By using the above technique, the Al film is not exposed to the etching gas in the plasma and is protected against the corrosion of Al due to the removal of the residual fluorine or chlorine components.

In the above embodiment, the evacuation and the plasma treatment after the dry etching are conducted in the same vacuum ambient following to the dry etching without exposing the chamber to the atmosphere. In addition thereto, the residual fluorine or chlorine components can be removed by water washing or removal of photoresist mask while exposing the substrate to the atmosphere after the dry etching, as in the above embodiment. In such a case, however, the water washing etc. must be conducted in an early stage of the exposure before the fluorine or chlorine components attached onto the substrate etc. reacts with the water in the atmosphere.

Accordingly, the water washing step etc. should be conducted using a batch treatment, which allows the washing of the bottom surfaces of the plurality of substrates at a time. The washing step should be conducted within ten minutes after exposing the chamber to the atmosphere upon completion of the dry etching.

In the above embodiment, the protection film is formed by the hot-water washing following to the water washing after the wet etching for the signal-line metallic film; however, the hot-water washing may be conducted concurrently with the water washing after removal of the photoresist mask. In such a case, the dry etching for forming the channel may be conducted using the source/drain metallic electrodes as a mask.

Subsequently, a plasma-enhanced CVD process is conducted to deposit a 200-nm-thick passivation layer 26 made of silicon nitride, followed by a photolithographic and etching process to form pixel contact holes 35 in the pixel area and terminal contact holes 36 outside the pixel area. It is to be noted that the term "about" may be omitted for modifying the dimensions as used herein and hereinafter.

Subsequently, a 50-nm-thick transparent conductor film made of indium-tin-oxide (ITO) or indium-zinc-oxide (IZO) is formed by sputtering, followed by a photolithographic and etching process to form pixel electrodes 27 and electrode pads 37, and annealing the substrate etc. at a temperature of 270 degrees C. to obtain the TFT panel, as shown in FIG. 3E.

A 50-nm-thick orientation film 41 is then formed by a printing technique on the TFT substrate 10, followed by baking at a temperature of about 220 degrees C. for an orientation treatment.

Figure 4:
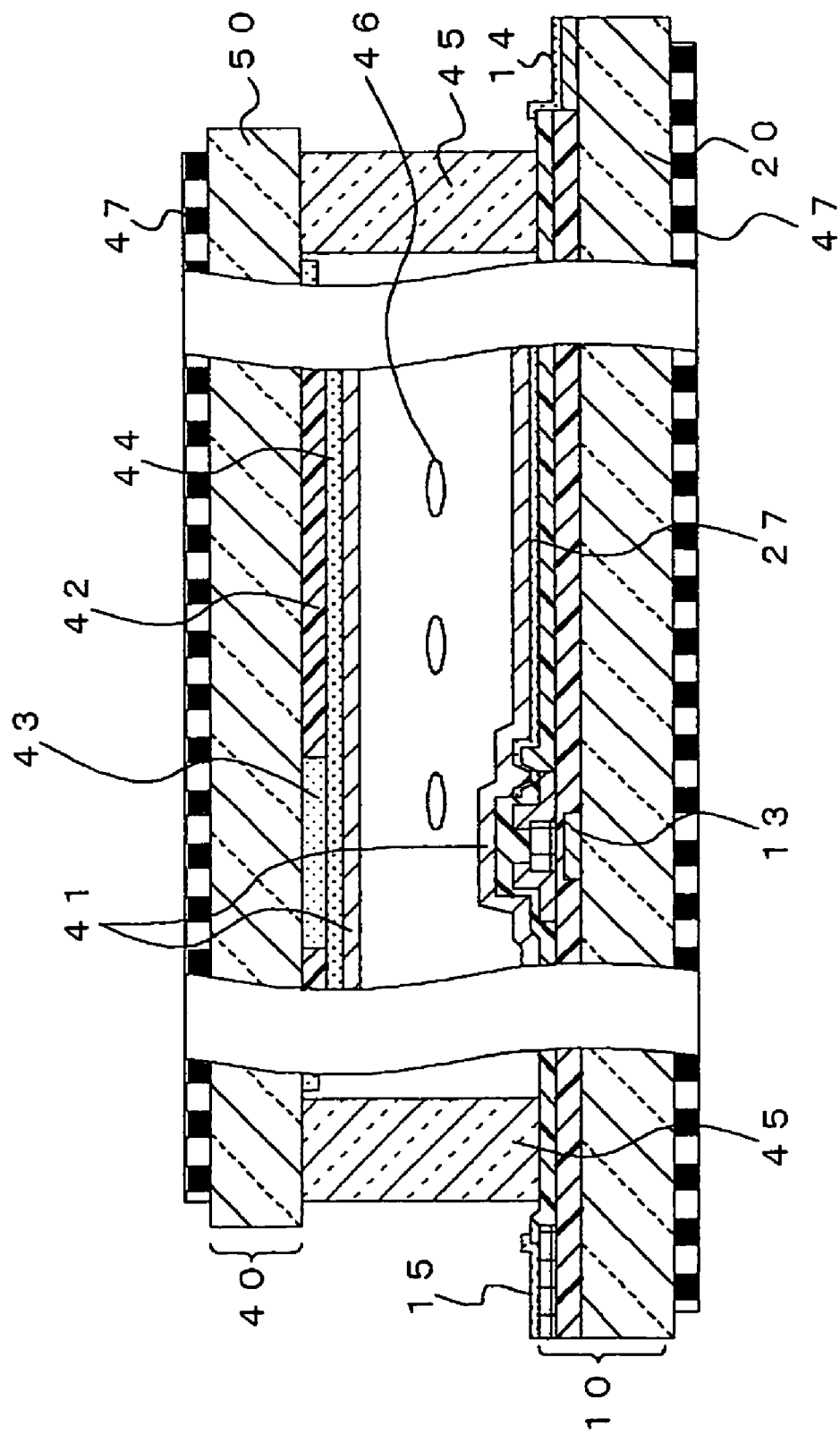
FIG. 4 is a sectional view of an LCD device including the TFT panel obtained by the fabrication process of the first embodiment.

Referring to FIG. 4, a counter panel 40 for opposing the TFT panel 10 is also fabricated. The counter panel 40 includes a 0.7-mm-thick transparent insulator substrate 50 made of non-alkali glass, and color filters 42 corresponding to respective pixel areas in the TFT panel 10, a black matrix 43 corresponding to the periphery of each pixel area, and a common electrode 44 made of transparent conductor covering the color filters and matrix, which are formed on the transparent insulator substrate 50. A 50-nm-thick orientation film 41 is then formed as the topmost layer for the counter panel 40 by using a printing technique, followed by baking at a temperature of about 220 degrees C. for a orientation treatment.

As illustrated in FIG. 4, the TFT panel 10 and the counter panel 40 are disposed at a specified distance, with an intervention of a seal 45 and in-plane spacers (not shown) made of plastic particles. The orientation films 41 on both the TFT panel 10 and counter panel 40 oppose each other. Then, liquid crystal 46 is injected through an injection hole (not shown) of the seal 45 between the TFT panel 10 and the counter panel 40 to form a LC layer. The injection hole is then closed by filling the injection hole with UV-hardened acrylate-based resin. Finally, a pair of polarizing plates 47 are adhered onto the outer surfaces of the TFT panel 10 and the counter panel 40 to complete the LCD panel shown in FIG. 4.

Thereafter, tape carrier packages (TCPs) connected to LCD drivers are attached onto the scanning terminals 14 and signal terminals 15 of the TFT panel 40 by pressure welding to obtain an LCD device.

Figure 5:
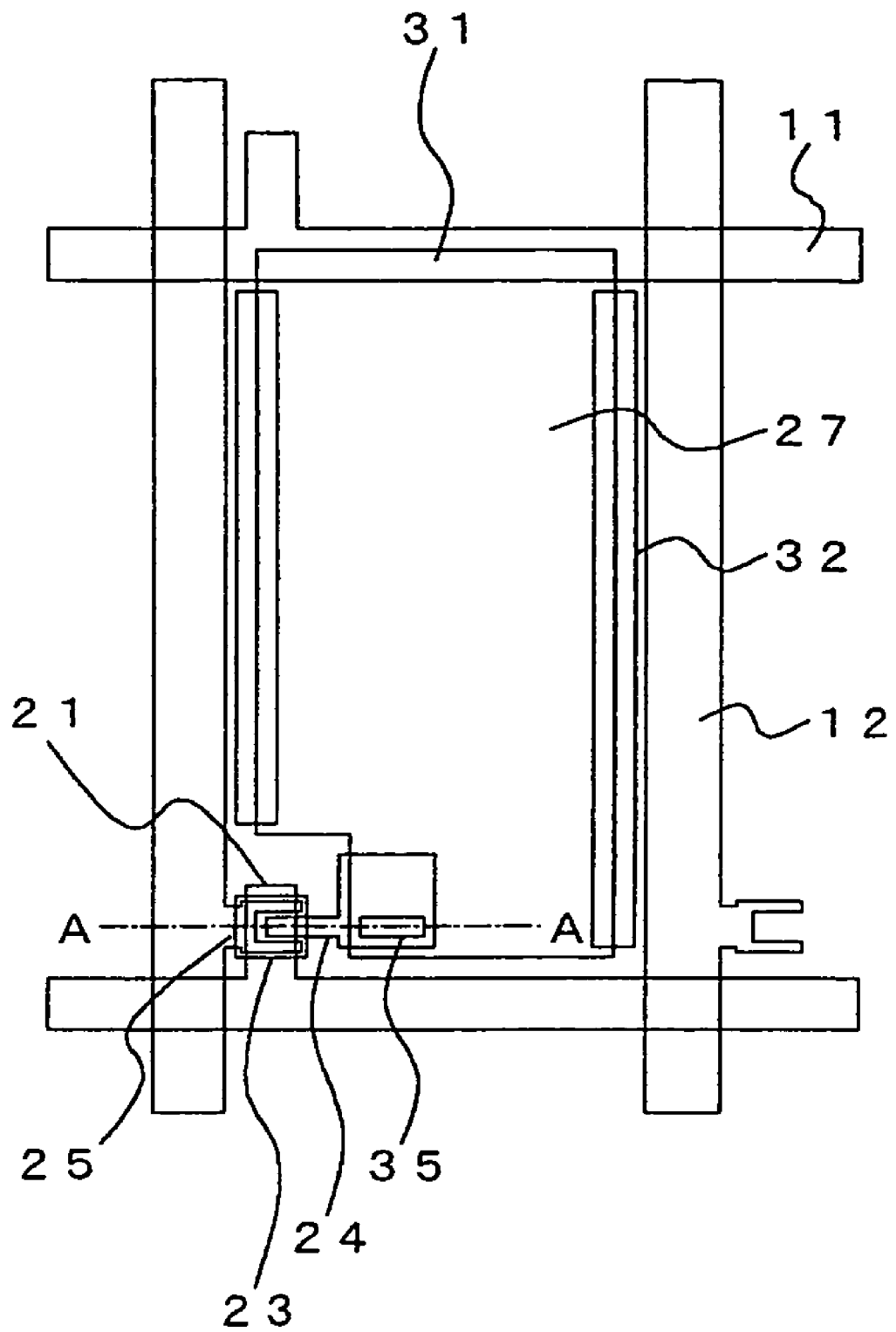
FIG. 5 is a schematic top plan view of a pixel in a TFT panel manufactured by a method according to a second embodiment of the present invention.

Referring to FIG. 5, a pixel in a LCD device according to a second embodiment of the present invention is formed on a TFT panel of a reverse-staggered, channel-etched type which is manufactured by using four masks. FIGS. 6A to 6D and FIGS. 7A to 7E illustrate sectional views of the TFT panel of the present embodiment during fabrication steps thereof. These sectional views are taken along lines A-A in FIG. 5, and other lines corresponding to B-B line and C-C line in FIG. 1.

Figures 6A, 6B:
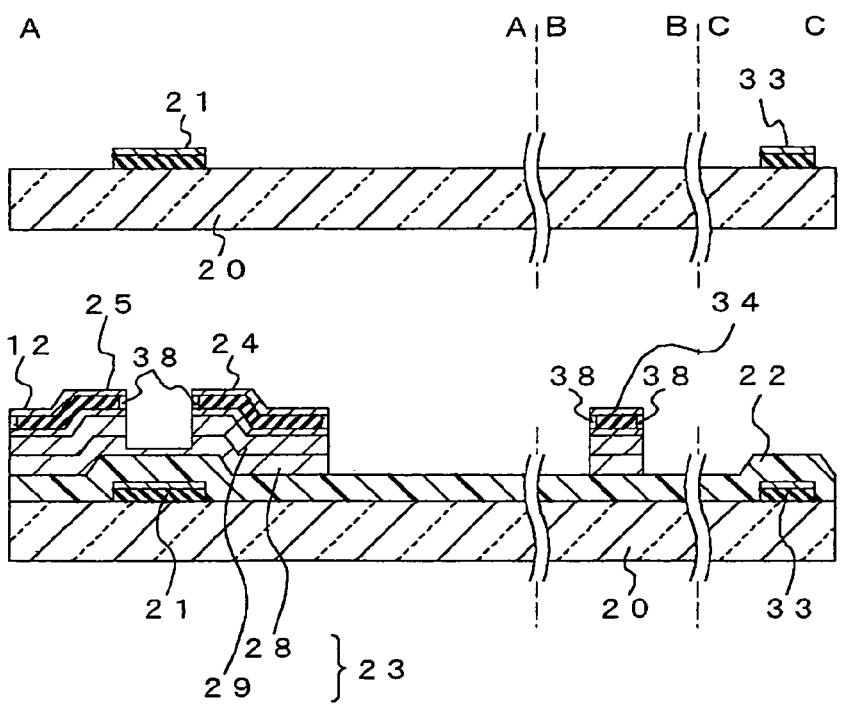
FIGS. 6A to 6D are sectional views of the TFT panel of FIG. 5 in consecutive steps of a fabrication process of the second embodiment.
Figure 6C:
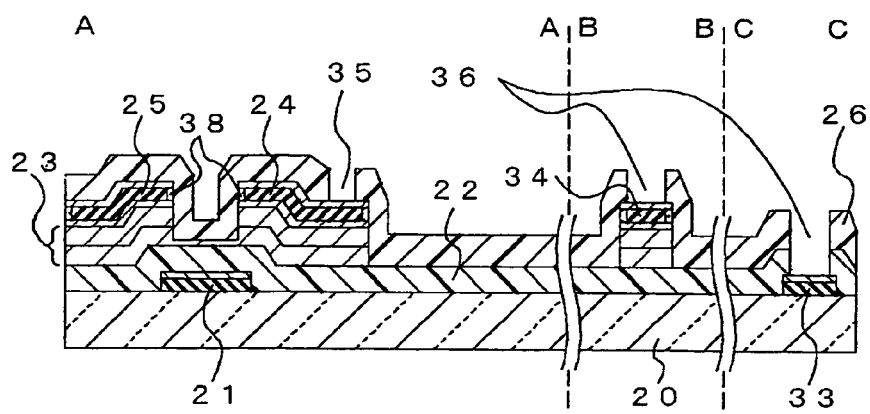
Figure 6D:
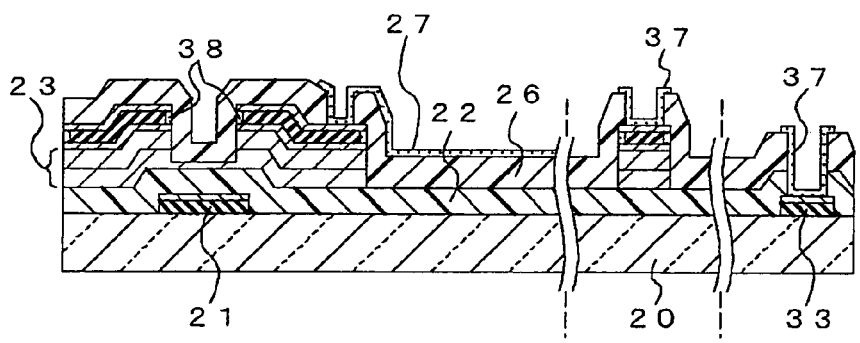

The TFT panel shown in FIG. 6D includes a transparent insulator substrate 20 on which a plurality of pixel areas such as shown in FIG. 5 are defined. Each pixel includes a gate electrode 21 to which one of scanning lines 11 extending in the row direction of the pixels is connected. An electrode 31 of a storage capacitor opposes one of the scanning lines 31 corresponding to the pixels of the precedent row. A shield layer 32 shields TFTs, scanning lines 31 and signal lines 12, which define the pixel areas. Metallic terminal film 33 on the scanning terminal 14 is connected to one of the scanning lines 11. A gate insulating film 22 is formed on the gate electrode 21, a semiconductor layer 23 opposes the gate electrode 21 with an intervention of the gate insulating film 22, and source/drain electrodes 24 and 25 are disposed separately from one another on the semiconductor layer 23.

The TFT panel formed by the second embodiment is similar to that formed by the first embodiment except that both the outer edges of the source electrode 24 and drain electrode 25 are disposed on the semiconductor layer 23 and thus aligned in the horizontal direction in the present embodiment. The passivation layer 26 overlies the source electrodes 24, drain electrodes 25, signal lines 12 connected to the drain electrodes 25 on the gate insulating film 22 and the metallic terminal films 34 on the signal terminals 15. The passivation layer 26 receives therein a pixel contact hole 35 in the pixel area and terminal contact holes 36 outside the pixel area. The pixel electrode 27 is connected to the source electrode 24 via the pixel contact hole 35, whereas pad terminals 37 are connected to the metallic terminal film 33 and 34 via he terminal contact holes 35. The capacitor electrode 31 and the pixel electrode 27 constitute a storage capacitor.

In the TFT panel shown in FIG. 6D, each of the source electrode 24, drain electrode 25, signal line 12 and metallic terminal film 34 has a three-layer structure including bottom HMPM film, intermediate Al film, and top HMPM film. A protection film 38 protects the side walls of the Al film.

The method of the present embodiment roughly includes the steps of forming the gate electrodes and scanning lines on the transparent insulator substrate (step (a)), forming thereon gate insulating film, source/drain electrodes, signal lines and semiconductor layers (step (b)), forming thereon the passivation layer and contact holes therein (step (c)), and forming thereon the pixel electrodes (step (d)). The step (b) is such that the source/drain electrodes and signal lines are formed to have a three-layer structure including an HMPM film, an Al film, and another HMPM film, the protection film is formed on the side walls of the Al film, and the dry etching for forming the semiconductor layers and the channels is followed by evacuation of the chamber without exposing the chamber to the atmosphere.

More specifically, a 200-nm-thick Al film and a 100-nm-thick HMPM film are consecutively deposited by sputtering onto a 0.7-mm-thick transparent insulator substrate 20 made of non-alkali glass, followed by patterning thereof using a photolithographic and etching technique to form the gate electrodes 21, scanning lines (not shown), capacitor electrodes (not shown) for the storage capacitors, shield layer, and metallic terminal films 33 for the scanning terminals, as shown in FIG. 6A. The materials for the Al film and the HMPM film as well as the etching process herein are similar to those described in the first embodiment.

Subsequently, a 400-nm-thick gate insulating film made 22 of silicon nitride, a 200-nm-thick a-Si film 28, and a 30-nm-thick N+-type a-Si film 29 are consecutively deposited thereon using a plasma-enhanced CVD technique. A 50-nm-thick HMPM film, a 200-nm-thick Al film and a 100-nm-thick HMPM film are then deposited using a sputtering technique, followed by patterning thereof using a photolithographic and etching technique to form the source/drain electrodes 24 and 25, signal lines 12, metallic terminal films 34 for the signal terminals, and semiconductor layer 23 including a-Si films 29 and 28 at a time, as shown in FIG. 6B.

In the present embodiment, the source/drain electrodes 24 and 25 and semiconductor layer 23 are configured in a single step, as will be described with reference to FIGS. 7A to 7E.

Figure 7A:
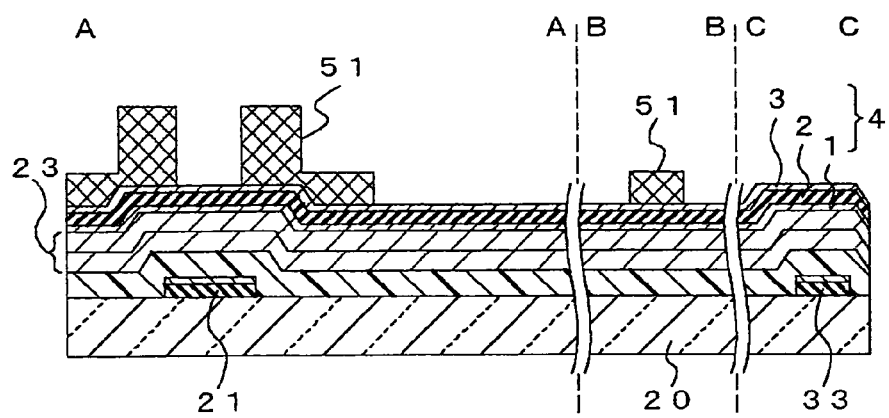
FIGS. 7A to 7E are sectional views of the TFT panel of FIG. 5, showing the detailed steps of a fabrication step of the second embodiment.

A photoresist film is formed by coating on the three-layer metallic structure 4 including the HMPM film 1, Al film 2 and HMPM film overlying the gate insulating film 22, a-Si film 28, N+-type a-Si film 29, followed by patterning thereof to form a photoresist mask 51, as shown in FIG. 7A. The photoresist mask 51 has a larger thickness at the portions covering the portions of the source/drain electrodes 24 and 25 opposing the channel region, and a smaller thickness at the other portions covering the other portions of the source/drain electrodes far from the channel region, signal lines and metallic terminal films, as understood from FIG. 7A.

Figure 7B:
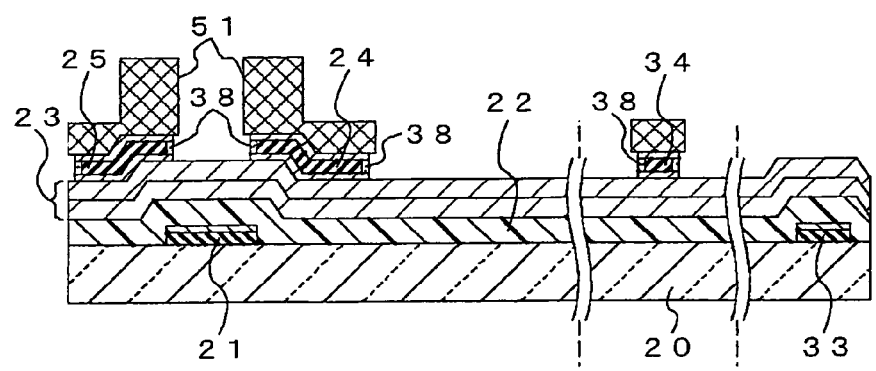

Subsequently, the three-layer metallic film 4 including the HMPM film 3, Al film 2 and HMPM film 1 is etched by a wet etching process using a side-etching technique, as shown in FIG. 7B, similarly to the first embodiment. After the wet-etching, water washing is conducted using hot water at 40 to 50 degrees C., thereby forming a protection film 38 made of Al oxide film or Al hydroxide film on the side walls of the Al film 2.

Figure 7C:
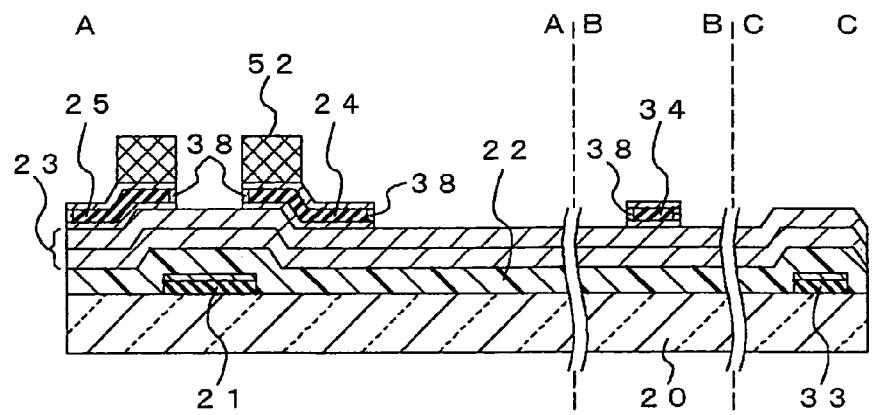

Thereafter, an ashing treatment is conducted using $O_2$ plasma to remove the portions of the photoresist mask 51 having a smaller thickness while configuring the portions of the photoresist mask 51 having the lager thickness to a photoresist mask 52 having a reduced thickness, as shown in FIG. 7C.

Figure 7D:
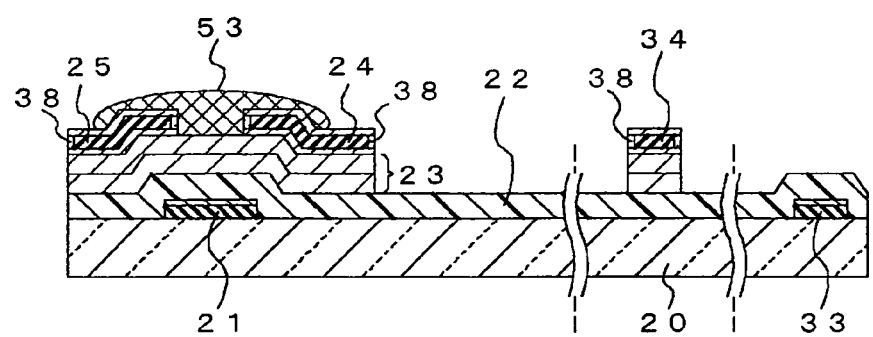

Subsequently, the photoresist mask 52 left in the ashing treatment is subjected to a reflow treatment using N-methyl-2-pyrrolidone (NMP) to configure the same as a photoresist mask 53, which covers the channel region exposed from the source/drain electrodes 24 and 25. Thereafter, the N+-type a-Si film 29 and a-Si film 28 are etched, as shown in FIG. 7D, using the photoresist mask 53, source/drain electrodes, signal lines and metallic terminal films as a mask. This dry etching is performed using fluorine-based gas, chlorine-based gas or mixed gas including fluorine-based gas and chlorine-based gas, such as mixed gas including $SF_6$, HCl and He, or a two-step etching using mixed gas including $CHF_3$, $O_2$ and He and mixed gas including $SF_6$, HCl and He, or a two-step etching using mixed gas using $CHF_3$, $O_2$ and He and mixed gas including $SF_6$, $CHF_3$ and He. However, use of only fluorine-based gas is more preferable. The etching is conducted using an RIE mode. After the dry etching, the chamber is evacuated without exposing the same to the atmosphere while maintaining the substrate away from the chamber electrodes, and a plasma treatment is conducted using $O_2$, $N_2$ or $H_2$ or He.

Figure 7E:
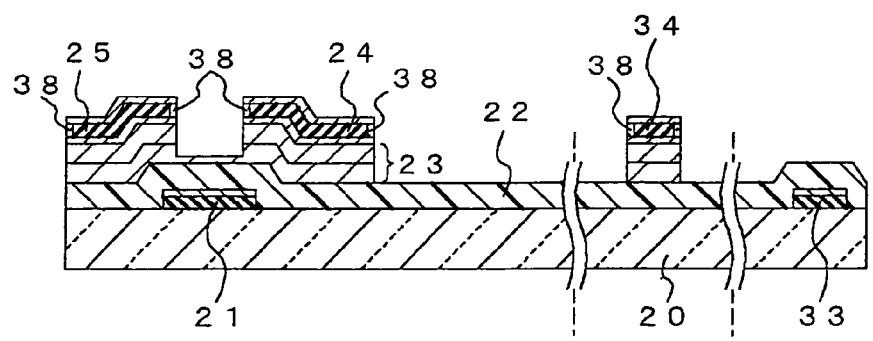

Thereafter, the photoresist mask 53 is quickly removed using a wet peel-off step, similarly to the first embodiment, followed by etching the N+-type a-Si film 29 between the source/drain electrodes 24 and 25 by using the source/drain electrodes 24 and 25 as a mask. Thus, source/drain electrodes 24 and 25, signal lines 12, metallic terminal films 34 for the signal lines, and semiconductor layer 23 are configured, as shown in FIG. 7E. The processes for configuring the channel region by etching the N+-type a-Si film 29, evacuation after the etching, and plasma treatment are similar to those described in the first embodiment. The water washing after the etching of the N+-type a-Si film 29 is conducted quickly similarly to the first embodiment. By using the above process, the Al film is not exposed to the plasma of the etching gas, and fluorine or chlorine components attached onto the substrate etc. can be removed to prevent corrosion of the Al film.

In the second embodiment, the dry etching for configuring the channel region is conducted using the metallic film of the source/drain electrodes as a mask. Etching for configuring the channel region may be conducted by using the photoresist mask 51 shown in FIG. 7B as a mask, after the metallic films of the signal lines are subjected to a wet etching process and a water washing process using hot water. In this case, the process advances from the channel region etching step to the step shown in FIG. 7C, although FIGS. 7C and 7D do not show the structure wherein the channel region is configured.

Subsequently, a 200-nm-thick passivation layer 26 made of silicon nitride is deposited by a plasma-enhanced CVD technique, followed by patterning thereof using a photolithographic and etching technique to form pixel contact holes 35 and terminal contact holes 36, as shown in FIG. 6C.

Thereafter, a 50-nm-thick transparent conductor film made of ITO or IZO is deposited by sputtering, followed by a photolithographic and etching step to form the pixel electrodes 27 and pad electrodes 37, and an annealing step at a temperature of 270 degrees C. to obtain the TFT panel, as shown in FIG. 6D. Thereafter, LCD device is fabricated from the TFT panel similarly to the first embodiment.

Referring back to FIG. 5, the pixel shown therein is also manufactured by a method according to a third embodiment of the present invention, which will be described hereinafter with reference to FIGS. 6A to 6D and FIGS. 8A to 8E. FIGS. 8A to 8E are taken along line A-A in FIG. 5, and lines corresponding to lines B-B and C-C in FIG. 1. The LCD device manufactured by the present embodiment includes a TFT panel of a reverse-staggered channel-etched type and manufactured by using four masks. The third embodiment is similar to the second embodiment except for the step (b) and the LCD device manufactured by the third embodiment is similar to that manufactured by the second embodiment.

The method of the third embodiment roughly includes, similarly to the second embodiment, the steps of forming the gate electrodes and scanning lines on the transparent insulator substrate (step (a)), forming thereon gate insulating film, source/drain electrodes, signal lines and semiconductor layers (step (b)), forming thereon the passivation layer and contact holes therein (step (c)), and forming thereon the pixel electrodes (step (d)). The step (b) is such that the source/drain electrodes and signal lines are formed to have a three-layer structure including an HMPM film, an Al film, and another HMPM film, a protection film is formed on the side walls of the Al film, and the dry etching for configuring the semiconductor layers in the channel regions is followed by evacuation of the chamber without exposing the substrate etc. (chamber) to the atmosphere.

The steps other than the step (b) in the present embodiment are similar to those in the second embodiment, and accordingly only the step (b) in the third embodiment will be described hereinafter with reference to FIGS. 8A to 8E.

Figure 8A:
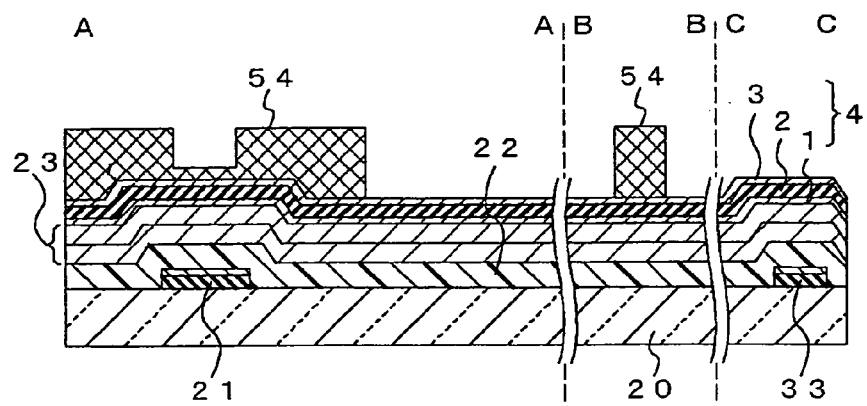
FIGS. 8A to 8E are sectional views of a TFT panel manufactured by a method according to a third embodiment of the present invention, showing consecutive detailed steps which correspond to the steps of FIGS. 7A to 7E.

A photoresist film is formed by coating on the three-layer metallic structure 4 including the HMPM film 1, Al film 2 and HMPM film 3, followed by patterning thereof using exposure and development steps to form a photoresist mask 54 having a stepped structure. The exposure step uses a half-tone mask or gray-tone mask to configure the photoresist mask 54 to have a smaller thickness at the locations overlying the channel regions, and a larger thickness at the locations overlying the source/drain electrodes, signal lines and metallic terminal films, as shown in FIG. 8A.

Figure 8B:
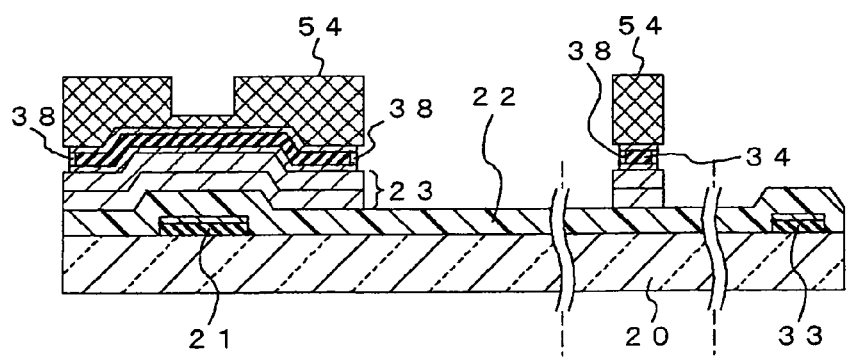

Subsequently, the three-layer metallic structure 4 including the HMPM film 3, Al film 2 and HMPM film 1 is patterned by etching using the photoresist mask 54, followed by etching the N+-type a-Si film 29 and a-Si film 28 by using the photoresist mask 54 and the three-layer metallic structure 4 as a mask, as shown in FIG. 8B. The three-layer metallic structure 4 is etched using a wet etching including the side etching, similarly to the first embodiment, wherein the edge portions of the three-layer metallic structure are retracted beyond the edges of the photoresist mask 54, as depicted in FIG. 8b. After the wet etching, water washing is conducted using hot water at a temperature of 40 to 50 degrees C., thereby forming a protection film 38 made of Al oxide or Al hydroxide on the edges of the Al film 2. Semiconductor layers 23 is etched similarly to the second embodiment, followed by evacuation of the chamber without exposing the substrate etc. to the atmosphere, and plasma-enhanced treatment using $O_2$, $N_2$, H6 or He gas while separating the substrate from the chamber electrodes.

Figure 8C:
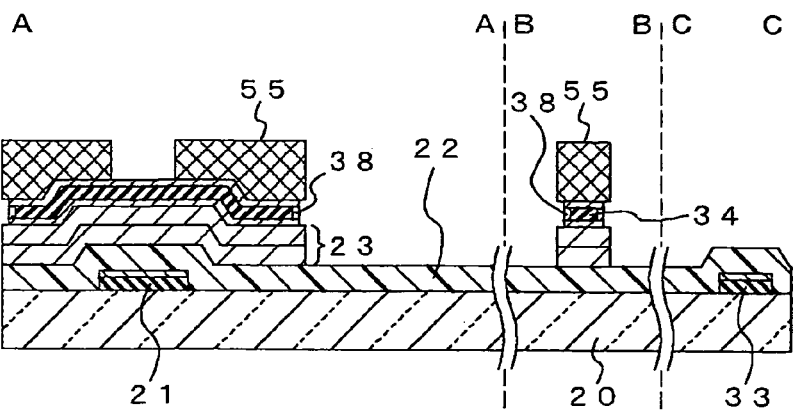

An ashing treatment is then conducted to the photoresist by using an $O_2$ plasma treatment to remove the portions of the photoresist mask 54 having the smaller thickness while configuring the portions of the photoresist mask 54 to a photoresist mask 55 having a reduced thickness, as shown in FIG. 8C. The $O_2$ plasma treatment is preferably conducted in the vacuum without exposing the chamber to the atmosphere after the etching of the semiconductor layer 23. On the other hand, if the chamber is to be exposed to the atmosphere, quick water washing should be conducted after the exposure.

Figure 8D:
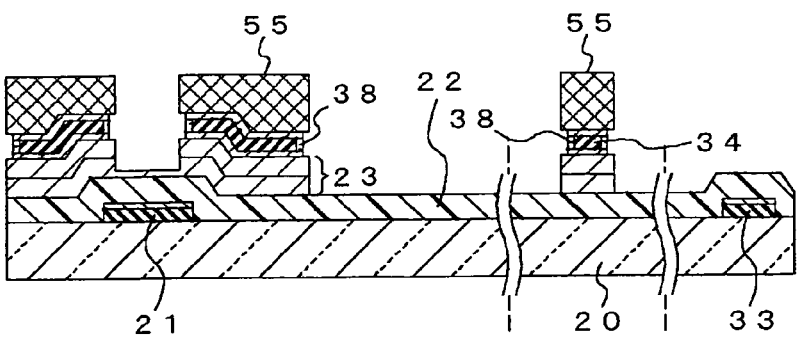

Thereafter, the three-layer metallic structure 4 including the HMPM film 3, Al film 2 and HMPM film 1 is etched at the locations overlying the channel regions, followed by etching the underlying N+-type a-Si film 29 at the channel regions, as shown in FIG. 8D. The three-layer metallic structure 4 is etched by a wet etching including a side etching similarly to the first embodiment. Water washing is conducted at a temperature of 40 to 50 degrees C. after the wet etching, thereby forming a protection film 38 made of Al oxide or Al hydroxide film on the side walls of the Al film 2. The etching of the N+-type a-Si film 29 at the channel region, evacuation after the etching and subsequent plasma treatment are similar to those in the first embodiment.

Figure 8E:
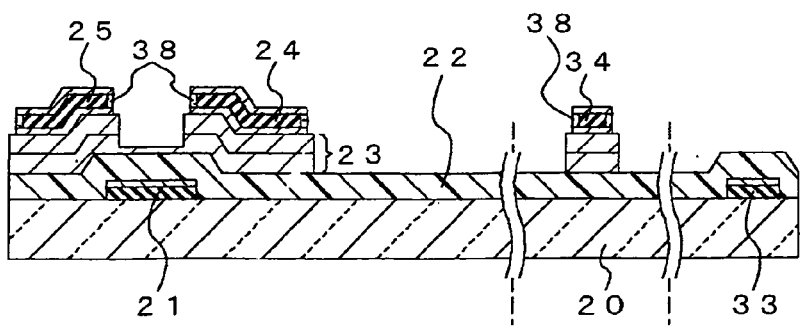

Subsequently, the photoresist mask 55 is quickly removed by a wet peel-off step, thereby obtaining the source/drain electrodes 24 and 25, signal lines 12, and metallic terminal films 34 for the signal terminals and semiconductor layer 23, as shown in FIG. 8E. Subsequent steps include forming a passivation layer, contact holes therein and electrodes, similarly to the second embodiment. It is to be noted that the edges of the three-layer metallic structure are not aligned with the edges of the semiconductor layer 23 to configure a stepwise structure in the present embodiment, as understood from FIGS. 8C to 8E.

As described above, by using the methods of the present invention, Al film is not exposed to the plasma of the etching gas, and fluorine and chlorine components attached onto the substrate etc. (TFT panel) can be removed, whereby corrosion of Al can be prevented.

In the above embodiments, the hot-water washing is conducted to form the protection film during the washing step after the wet etching of the portions of the three-layer metallic structure overlying the channel regions. However, the hot-water washing may be performed during water washing after the peel-off step for the photoresist mask. In this case, the dry etching for configuring the channel regions should be conducted using the source/drain electrodes as a mask.

Figure 9:
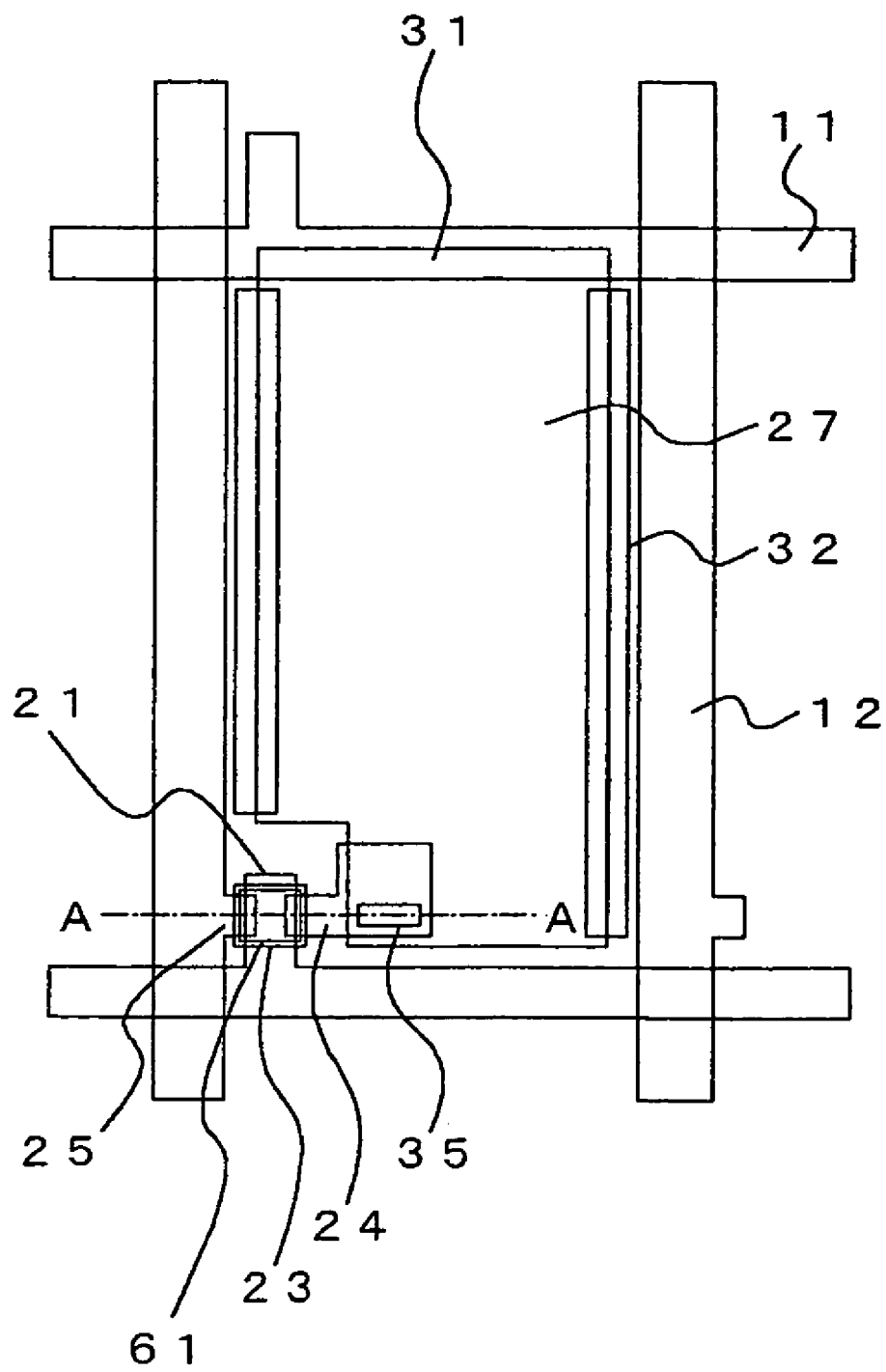
FIG. 9 is a schematic top plan view of a pixel in a TFT panel manufactured by a method according to a fourth embodiment of the present invention.

Referring to FIG. 9, there is shown a pixel of a TFT panel manufactured by a method according to a fourth embodiment of the present invention. The method of the present embodiment will be described with reference to FIGS. 10A to 10E, which show the pixel similarly to FIGS. 8A to 8E. The TFT panel manufactured by the method of the present embodiment is of a reverse-staggered channel protection type and manufactured using five masks.

Figure 10A:
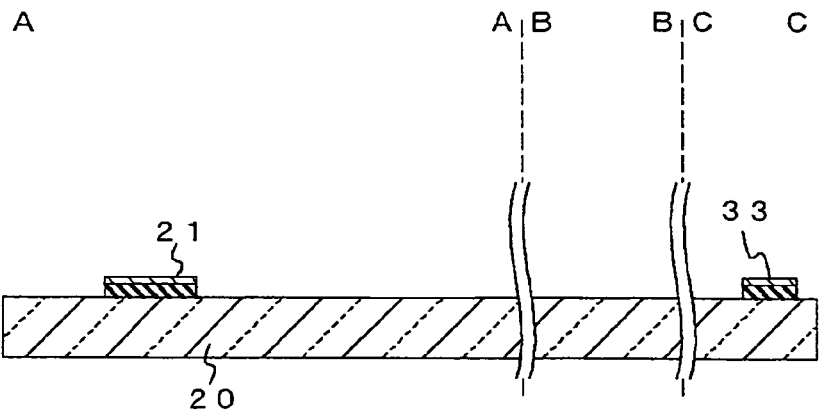
FIGS. 10A to 10E are sectional views of the TFT panel of FIG. 9 in consecutive steps of a fabrication process of the fourth embodiment.
Figure 10B:
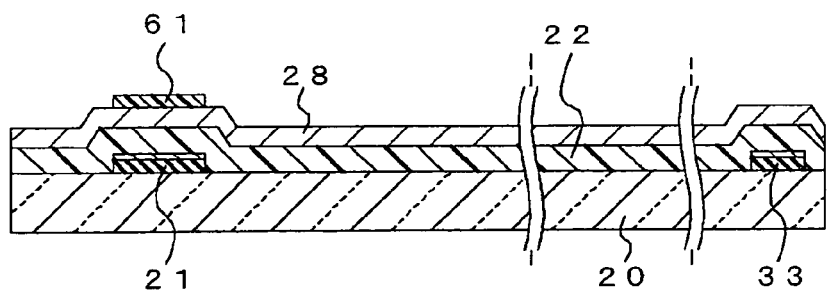
Figure 10C:
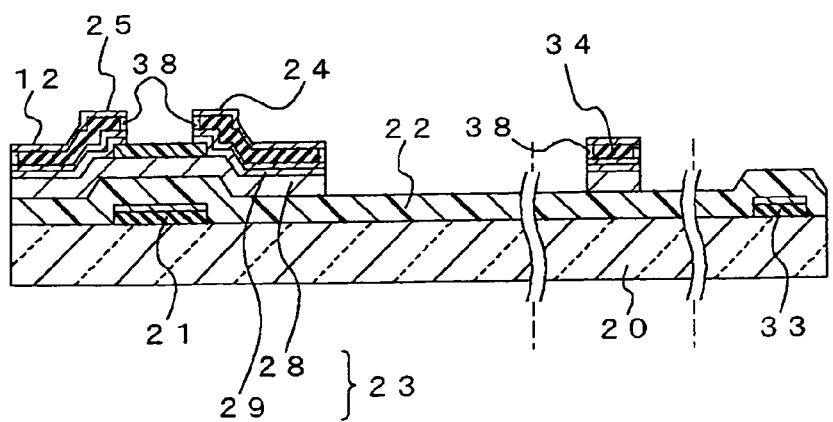
Figure 10D:
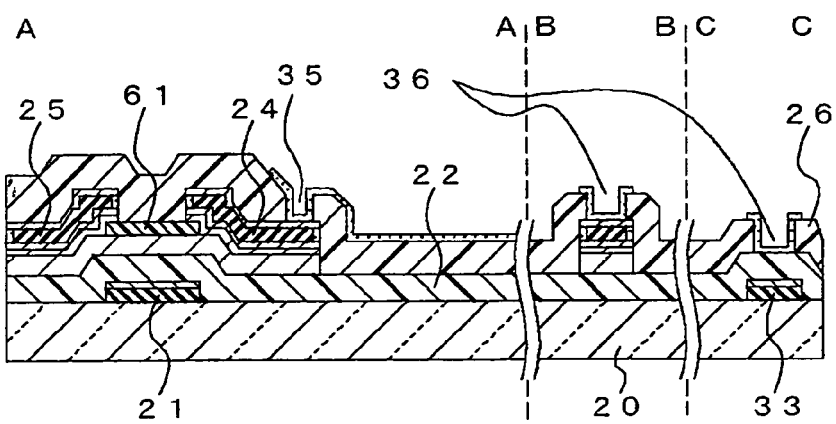
Figure 10E:
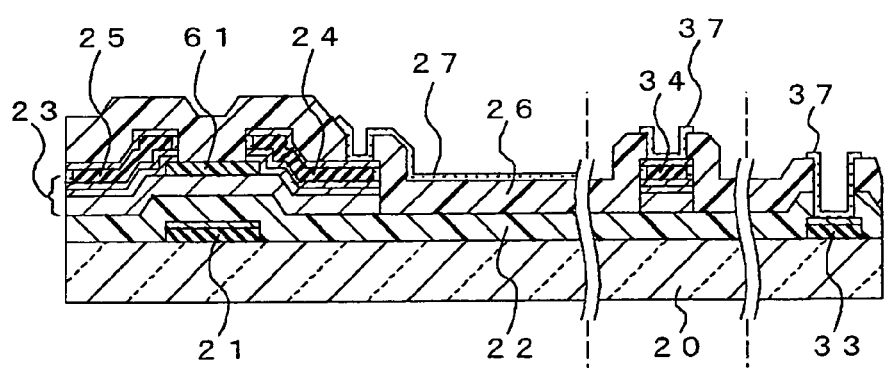

As shown in FIG. 9 and 10E, the TFT panel includes a transparent insulator substrate 20, on which the gate electrodes 21, scanning lines 11 connected to the gate electrodes 21, capacitor electrodes 31 opposing scanning lines for the preceding rows, shield layer, and metallic terminal films 33 for the scanning terminals 14 are formed. The gate insulating film 22 is provided on the gate electrode 21, and the semiconductor layer 23 and channel protection film 61 are formed on the gate insulating film 22 to oppose the gate electrode 21. The source/drain electrodes 24 and 25 overlie the semiconductor layer 23 to oppose each other in the horizontal direction. The channel protection film 61 features the third embodiment.

The passivation layer 26 covers the source/drain electrodes 24 and 25, signal lines 12 connected to the drain electrode 25 on the gate insulating film 22, and the metallic terminal films 34 for the signal terminals 15. The passivation layer 26 receives therein pixel contact hole 35 and terminal contact holes 36, through which the pixel electrode 27 and pad electrode 37 are connected to the source electrode 24 and the metallic terminal film 33, respectively. The capacitor electrode 31 and the pixel electrode 27 constitute a storage capacitor.

As illustrated in FIG. 10E, the source/drain electrodes 24 and 25, signal lines 12, metallic terminal films 34 for the signal terminals have a three-layer metallic structure including a HMPM film, an Al film and another HMPM film. A protection film 38 is formed on the side walls of the Al film.

The method of the present embodiment includes the steps of forming gate electrodes and scanning lines on a transparent insulator substrate (step (a)), forming gate insulating film, a-Si film, channel protection film (step (b)), forming source/drain electrodes, signal lines and semiconductor layer (step (c)), forming passivation layer and contact holes therein (step (d)), and forming pixel electrodes (step (e)). The source/drain electrodes and signal lines have a three-layer metallic structure including a HMPM film, an Al film and another HMPM film, and protection films are formed on the side walls of the Al film. Evacuation of the chamber is conducted after the dry etching for forming the semiconductor layers and channel regions without exposing the substrate etc. to the atmosphere.

A 200-nm-thick Al film and 100-nm-thick HMPM film are deposited by sputtering onto a 0.7-mm-thick transparent insulator substrate made of non-alkali glass, followed by a photolithographic and etching step to form gate electrodes 21, scanning lines (not shown), capacitor electrodes (not shown), shield layers (not shown), metallic terminal films 33 for the scanning terminals, as shown in FIG. 10A. The three-layer structure and the etching process therefor are similar to those in the first embodiment.

Subsequently, a 400-nm-thick gate insulating film 22 made of silicon nitride, a 80-nm-thick a-Si film 28, and a 100-nm-thick silicon nitride film are consecutively deposited using a plasma-enhanced CVD technique, followed by a photolithographic and etching step to configure a channel protection film 61 made of silicon nitride disposed on the a-Si film 28 to oppose the gate electrode 21, as shown in FIG. 10B.

Thereafter, a 30-nm-thick phosphorous-doped N+-type a-Si film 29 is formed thereon using plasma-enhanced CVD technique, followed by consecutive deposition of a 50-nm-thick HMPM film, a 200-nm-thick Al film and a 100-nm-thick HMPM film by sputtering. These metallic films and a-Si films 29 and 28 are then patterned using a photolithographic and etching technique to form source/drain electrodes 24 and 25, signal lines 12, metallic terminal films 34 for the signal terminals and semiconductor layer 23, as shown in FIG. 10C. This etching includes etching of the three-layer metallic structure including the HMPM film, Al film and HMPM film by using a photoresist mask, and etching of the semiconductor layer 23 including N+-type a-Si film 29 and the a-Si film 28 by using the three-layer metallic structure as a mask. The channel protection film 61 functions as an etch stop layer in the dry etching for leaving the channel region of the a-Si film 28 un-etched.

The etching of the three-layer metallic structure for the signal lines uses a wet etching including a side etching, and is followed by a water washing step using hot water at a temperature of 40 to 50 degrees C. The etching of the semiconductor layer 23 is similar to that in the second embodiment, and is followed by evacuation of the chamber without exposing the substrate etc. to the atmosphere and by a plasma treatment step using $O_2$, $N_2$, $H_2$ or He gas. The etching of the semiconductor layer 23 etches the portion of the N+-type a-Si film 29 at the channel region. Subsequently, the photoresist mask is quickly removed by peel-off after the etching.

As described above, by using the above embodiment, the Al film is not exposed to the plasma of the etching gas, and the fluorine and chlorine components attached onto the substrate etc. can be removed, whereby Al corrosion can be prevented.

In the above embodiments, the hot-water washing is conducted to form the protection film during the washing step after the wet etching of the three-layer metallic structure. However, the hot-water washing may be performed during the water washing after the peel-off step for the photoresist mask. In this case, the dry etching for the channel regions and regions other than the TFT regions should be conducted using the source/drain electrodes as a mask.

Subsequently, a 200-nm-thick passivation layer made of silicon nitride is deposited by a plasma-enhanced CVD technique, followed by patterning thereof using a photolithographic and etching technique to form therein pixel contact holes 35 and terminal contact holes 36, as shown in FIG. 10D.

Thereafter, a 50-nm-thick transparent conductor film made of ITO or IZO by sputtering, followed by a photolithographic and etching step to form the pixel electrodes 27 and pad electrodes 37, and an annealing step conducted at a temperature of 270 degrees C. to obtain the TFT panel, as shown in FIG. 10E. Thereafter, an LCD device is fabricated from the TFT panel similarly to the first embodiment. Thereafter, an LCD device is fabricated using the TFT panel similarly to the first embodiment.

Experiments were conducted for assuring the advantages of the present invention. First experiments were conducted for the samples of the first embodiment each having a photoresist mask or no photoresist mask during the etching of the N+-type a-Si film at the channel region, as well as having a protection film or no protection film on the Al film during the etching. The samples were observed as to whether or not corrosion of Al occurred in the Al film. The dry etchings conducted included an etching using mixed gas of $Cl_2$ and $O_2$, a two-step etching including a first etching using mixed gas of $CHF_3$, He and $O_2$ and a second etching using mixed gas of $SF_6$, HCl and He, and another two-step etching including a first etching using mixed gas of $CHF_3$, He and O2 and a second etching using $SF_6$, $CHF_3$ and He.

Table 1 represents the results of the first experiments, showing the relationship between the presence or absence of the photoresist film and protection film and the degree of observed Al corrosion in the Al film.

TABLE 1

| Presence of Photoresist mask | No | Yes | No | Yes |
|---|---|---|---|---|
| Presence of Protection film | No | No | Yes | Yes |
| $CL_2/O_2$ | XX | ○ | Δ | ○ |
| $CHF_3/He/O_2$ + $SF_6/HCl/He$ | XX | Δ | Δ | ○ |
| $CHF_3/He/O_2$ + $SF_6/CHF_3/He$ | X | Δ | Δ | ○ |

In the table 1, a well as Tables 2 and 3 to follow, X X represents a higher degree of observed corrosion, X represents a medium degree of observed corrosion, Δ represents a lower degree of observed corrosion, and ○ represents absence of observed corrosion.

It is to be noted that the evacuation and subsequent $O_2$ plasma treatment were not conducted after the dry etching. The Al corrosion was observed using an optical microscope upon completion of one-hour exposure to the atmosphere after takeout of the TFT panel subjected to the dry etching.

Second experiments were such that samples of the first embodiment were subjected to evacuation and $O_2$ plasma treatment after the dry etching, and observed for the Al corrosion in the signal lines. Table 2 represents the results of the second experiments, showing the relationship between the time lengths of the evacuation and the $O_2$ plasma treatment and the degree of observed Al corrosion.

TABLE 2

| Time length of evacuation (seconds) | Time length of O2 plasma treatment (seconds) | | | | |
|---|---|---|---|---|---|
| | 0 | 30 | 60 | 120 | 180 |
| 5 | X | X | X | X | — |
| 60 | X | X | X | X | Δ |
| 120 | X | Δ | Δ | ○ | — |
| 240 | Δ | ○ | ○ | ○ | — |

The second experiments were conducted for the case wherein photoresist mask and the protection film were not provided after the dry etching using a two-step etching including a first etching using mixed gas of $CHF_3$, He and $O_2$, and a second etching using mixed gas of $SF_6$, HCl and He. The Al corrosion was observed using an optical microscope upon completion of one-hour exposure to the atmosphere after takeout of the TFT panel subjected to the dry etching.

Third experiments were such that samples of the first embodiment were exposed to the atmosphere after the dry etching similar to the dry etching of the first experiments, wherein relationship between the time length of exposure to the atmosphere before the washing for removal of the photoresist mask and the observed Al corrosion. In the third experiments, the protection film was not provided on the side walls of the Al film during a two-step etching including a first etching using mixed gas of $CHF_3$, He and $O_2$, and a second etching using mixed gas of $SF_6$, HCl and He, and the evacuation and $O_2$ treatment were not conducted after the dry etching. These samples were observed using an optical microscope after the wet peel-off of the photoresist mask by using a water washing step. Table 3 shows the results of the third experiments, showing the relationship between the time length of the exposure to the atmosphere and the degree of observed Al corrosion.

TABLE 3

| Time length of exposure (minutes) | Results |
|---|---|
| 10 | ○ |
| 20 | Δ |
| 60 | X |
| 120 | XX |

It was found by the experiments that chlorine-based gas such as $Cl_2$ and HCl is more likely to cause Al corrosion than fluorine-based gas such as $CHF_3$, and that the Al corrosion is caused even without using chlorine-based gas. It was also found that the Al corrosion was effectively prevented by the dry etching using the photoresist mask and/or the protection by the protection film covering the side walls of the Al film, and that the presence of both the photoresist mask and the protection film substantially completely suppresses the observed Al corrosion. In addition, longer time lengths for the evacuation and $O_2$ plasma treatment as well as shorter time length of exposure to the atmosphere before the washing for removal of the photoresist mask prevents the Al corrosion with a higher degree.

Accordingly, it is important not to expose the side walls of the Al film to the plasma of the etching gas and to remove or replace the chlorine components and the fluorine components remaining on the substrate etc. By combining these measures, the prevention of the Al corrosion can be further improved.

In the above embodiments, the present invention is applied to a LCD device of a twisted nematic (TN) mode liquid crystal; however, the present invention can be applied to a LCD device of an in-plane switching (IPS) mode liquid crystal. This is because, although the pixel electrode is generally made of a metallic film in a TFT panel of an IPS-mode LCD device, a transparent conductor film on the passivation layer is used for coupling the pad electrodes for the terminals and common lines as well as for the layer exchange between the gate layer and the drain layer of protection transistors in the TFT panel, and thus the fabrication process is common to the TN-mode LCD device and the IPS-mode LCD device. In addition, since there is a technique for forming a transparent conductor film on the passivation layer in the IPS-mode LCD device to configure the pixel electrodes and common electrode for improving the effective pixel area ratio, the present invention can be applied to the IPS-mode LCD device.

In the above embodiments, the protection for the Al film was implemented by hot-water washing; however, a plasma treatment using oxygen or nitrogen may be used for forming an Al oxide or nitride film, although this technique increases the number of fabrication steps. In this technique, the plasma treatment should be of an isotropic plasma-enhanced mode to thereby form a protection film having a thickness of about 100 nm or above, the thickness being measured in the horizontal direction. It is to be noted that a protection film having a thickness below 100 nm may allow ingress of the etching gas during the dry etching through a defective portion of the protection film, to thereby cause the Al corrosion.

In the above embodiments, the signal lines has a three-layer metallic structure including HMPM film, Al film and HMPM film; however, the present invention can be applied to any multilayer metallic structure including a two-layer metallic structure including HMPM film and Al film. In the case of two-layer metallic structure, the TFT panel should have a structure wherein the pixel electrode underlies the signal lines. The a-Si films including N+-type a-Si film in the above embodiments may be replaced by polysilicon films.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a liquid crystal display (LCD) device comprising:

consecutively forming a semiconductor layer and a multilayer metallic film to overlie a substrate, said multilayer metallic film including a high-melting-point metal (HMPM) film and a first metallic film having a lower resistivity than said HMPM film, wherein the first metallic film comprises an Al or Al-alloy film;

forming a photoresist mask on said multilayer metallic film;

patterning said multilayer metallic film by using said photoresist mask to form a multilayer metallic pattern, said patterning including a side etching for retracting edges of said multilayer metallic pattern beyond edges of line patterns of said photoresist mask;

forming a protection film after said patterning comprising at least one of Al oxide or Al hydroxide on exposed portions of said first metallic film by hot-water washing;

dry-etching at least a portion of said semiconductor layer after forming said protection film by using said photoresist mask as an etching mask; and removing said photoresist mask, wherein said patterning step includes wet etching.

2. The method according to claim 1, wherein said dry etching step uses fluorine-based gas.

3. A method for manufacturing a liquid crystal display (LCD) device comprising:

consecutively forming a semiconductor layer and a multilayer metallic film to overlie a substrate, said multilayer metallic film including a high-melting-point metal (HMPM) film and a first metallic film having a lower resistivity than said HMPM film, wherein the first metallic film comprises an Al or Al-alloy film;

forming a photoresist mask on said multilayer metallic film;

patterning said multilayer metallic film by using said photoresist mask to form a multilayer metallic pattern;

removing said photoresist pattern;

forming a protection film after said patterning comprising at least one of Al oxide or Al hydroxide on exposed portions of said first metallic film by hot-water washing; and dry-etching at least a portion of said semiconductor layer after forming said protection film by using said multilayer metallic film as an etching mask, wherein said photoresist mask removing step includes a wet peel-off step.

4. The method according to claim 3, wherein said dry etching step uses fluorine-based gas.

5. The method according to claim 1, wherein the hot-water washing is conducted at a temperature of from 40-50° C.

6. The method according to claim 1, wherein a thickness of the protection film measured in the horizontal direction is from 200-300 nm.

7. The method according to claim 3, wherein the hot-water washing is conducted at a temperature of from 40-50° C.

8. The method according to claim 3, wherein a thickness of the protection film measured in the horizontal direction is from 200-300 nm.

9. The method according to claim 1, wherein said dry-etching is dry-etching a portion of said semiconductor layer in a channel region.

10. The method according to claim 1, wherein said dry-etching is dry-etching a portion of said semiconductor layer in a channel region and a region other than a TFT region.

11. The method according to claim 1, wherein said dry-etching is dry-etching a portion of said semiconductor layer in a region other than a TFT region.

12. The method according to claim 3, wherein said dry-etching is dry-etching a portion of said semiconductor layer in a channel region.

13. The method according to claim 3, wherein said dry-etching is dry-etching a portion of said semiconductor layer in a channel region and a region other than a TFT region.

* * * * *